(12) United States Patent
Hsu et al.

(10) Patent No.: US 6,751,156 B2
(45) Date of Patent: Jun. 15, 2004

(54) SEMICONDUCTOR MEMORY SYSTEM HAVING DYNAMICALLY DELAYED TIMING FOR HIGH-SPEED DATA TRANSFERS

(75) Inventors: Louis L. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/042,604

(22) Filed: Jan. 9, 2002

(65) Prior Publication Data

US 2003/0128573 A1 Jul. 10, 2003

(51) Int. Cl.[7] ................................................. G11C 8/00
(52) U.S. Cl. ................... 365/233; 365/194; 365/230.06
(58) Field of Search .................. 365/230.03, 230.06, 365/233, 219, 220, 189.05, 189.09, 189.11, 190, 194, 149

(56) References Cited

U.S. PATENT DOCUMENTS

| | | | | |
|---|---|---|---|---|
| 5,499,215 A | * | 3/1996 | Hatta | 365/230.03 |
| 6,002,633 A | * | 12/1999 | Oppold et al. | 365/230.03 |
| 6,314,048 B1 | * | 11/2001 | Ishikawa | 365/230.06 |
| 6,366,515 B2 | * | 4/2002 | Hidaka | 365/222 |
| 6,538,932 B2 | * | 3/2003 | Ellis et al. | 365/194 |

* cited by examiner

Primary Examiner—Gene Auduong
(74) Attorney, Agent, or Firm—Louis J. Percello and Dilworth & Barrese, LLP

(57) ABSTRACT

A timing system for controlling timing of data transfers within a semiconductor memory system is provided. The timing system includes a programming circuit for generating a bias signal, wherein the bias signal is biased in accordance with an incoming data transfer address corresponding to a memory address of the memory system, and a delay module for receiving the bias signal and generating an output clock signal, wherein the output clock signal is delayed in accordance with the bias signal.

19 Claims, 6 Drawing Sheets

US 6,751,156 B2

SEMICONDUCTOR MEMORY SYSTEM HAVING DYNAMICALLY DELAYED TIMING FOR HIGH-SPEED DATA TRANSFERS

FIELD OF THE INVENTION

This invention relates to the field of integrated circuit (IC) design. Specifically, it relates to dynamic delays for data transfers for a high-speed synchronous embedded semiconductor memory system having a micro-cell architecture.

BACKGROUND OF THE INVENTION

Memory performance has improved with the evolution from single data rate (SDR) to double data rate (DDR) dynamic random access memory (DRAM); the latter incorporating synchronization of internal timing signals with an external or system clock. The cycle time for synchronized DDR memory is typically 6.6 ns. Reduction of the cycle time below 4 ns, has been found to be extremely difficult to accomplish. Data bandwidth and system demand have continued to increase with the use of high-performance embedded DRAM (eDRAM), causing the need for reliable data transferring and a cycle time under 2 ns.

EDRAMs with wide data bandwidth and wide internal bus width have been proposed to be used as L2 (Level-2) cache to replace pure SRAM cache. Since each DRAM memory cell is formed by a transistor and a capacitor, the size of DRAM cache is significantly smaller than that of SRAM cache. In order to meet performance requirements, an eDRAM is formed of a plurality of blocks or micro-cells arranged in arrays forming one or more banks. A block is a small DRAM array unit formed by a plurality of wordlines (e.g., from 64 to 256) and a plurality of bitline pairs (e.g., from 64 to 256). The size of a block is much smaller (e.g., 16× to 256×) than that of a bank of a conventional stand-alone DRAM. Typically one block of each eDRAM bank is activated at a time. It is possible for blocks from different banks to be accessed simultaneously for simultaneous read and write operations. The read and write speed of an eDRAM can be fast due to very light loading of wordlines and bitlines.

An SRAM array of SRAM macros is provided for effectively utilizing the large eDRAM cache size. The SRAM array, similar in size to an eDRAM block, is provided for serving as a cache interface in-between the eDRAM bank(s) and one or more processors and for facilitating a high-speed pipeline operation in the eDRAM.

During high-speed data transfers it is important to preserve data integrity. Timing related problems such as data collision along a data path and mismatching of data and data addresses compromise data integrity. Thus, proper timing of data transfers affects data reliability.

One approach for providing a timing system for high-speed data transfers is to provide a distributed data clock for coordinating flow of data. However, the distributed data clock occupies additional valuable chip space. Even though this approach is practical for DRAMs having an array size of 16M and below, in an array size larger than 16M, a data-latching window for data located near the SRAM array interface would be shrunk too small to be acceptable for a reliable read/write operation.

To overcome this problem associated with the approach, it would be ideal to distribute the data, the associated address bits and control signals to each bank of the memory for providing a steady relative timing among the data, clock, address bits and control signals, etc. The resulting data-latching window would not be compromised regardless of the location of the data is being sent to or read from. Overlapping of read and write data pulses would be avoided. However, this solution would require approximately a two-fold increase of the size of the circuitry associated with the data paths. Hence, array efficiency would be significantly reduced and the chip size would be increased.

Accordingly, a need exists for a timing system in a high speed semiconductor memory system providing reliable high-speed data transfers without increasing the size of the semiconductor memory system. Furthermore, a need exists for a timing system in a high-speed semiconductor memory system in which data is transferred reliably at a high speed regardless of the location of the data being transferred, without increasing the size of the semiconductor memory system. Furthermore, a need exists for a method and system for providing a steady timing for data transfers within a high-speed semiconductor memory system, regardless of the location of the data being transferred, without increasing the size of the semiconductor memory.

SUMMARY

An aspect of the present invention is to provide a timing system in a compact semiconductor memory system in which data is transferred reliably at high speeds.

Another aspect of the present invention is to provide a timing system in a compact semiconductor memory system in which data is transferred at high speeds, and in which the reliability of the data transfer is independent of the location of the data being transferred.

Another aspect of the present invention is to provide a method and system for providing high-speed data transfers within a high performance semiconductor memory system, in which a steady latch window is provided for each data transfer, regardless of the location of the data being transferred.

Accordingly, a timing system for controlling timing of data transfers within memory system is provided. The timing system includes a programming circuit for generating a bias signal, wherein the bias signal is biased in accordance with an incoming data transfer address corresponding to a memory address of the memory system, and a delay module for receiving the bias signal and generating an output clock signal, wherein the output clock signal is delayed in accordance with the bias signal and therefore data address.

Furthermore, a method for controlling timing of data transfers within a memory system is provided including the steps of receiving an incoming address of a memory cell of the memory system transferring data; processing the incoming address; generating a bias signal in accordance with the processed incoming address; generating a clock output signal having a delay in accordance with the bias signal; and controlling release of data held in a control region of the eDRAM system during a data transfer via the clock output signal.

DETAILED DESCRIPTION OF THE INVENTION

The present invention provides a high capacity memory system such as an embedded DRAM (eDRAM) system having a micro-cell architecture, a wide data bandwidth and wide internal bus width, and data paths configured for implementing a data transfer protocol for achieving high-speed and high-integrity read operations regardless of the location of the data being transferred. A description will now be given as to the structure and operation of an exemplary high capacity embedded DRAM macro. In order to save chip area, the purpose of this description is to illustrate that the data transfer time is adjusted by providing a variable delay dependent upon the location of data being transferred, without increasing the size of the data transfer path.

Figure 1:
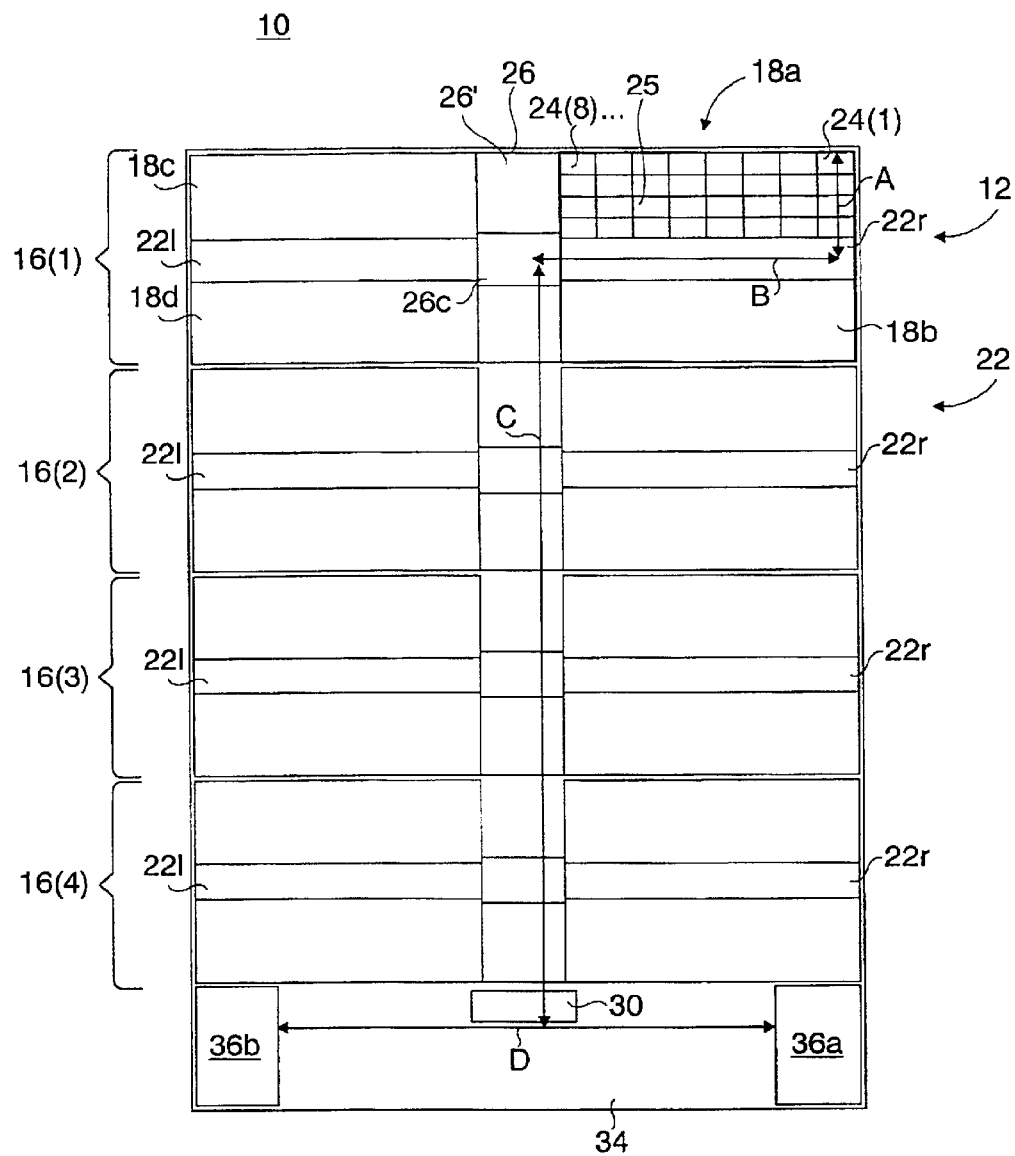
FIG. 1 is a block diagram of an exemplary eDRAM system having an eDRAM array including a micro-cell architecture according to the present invention.

With reference to FIG. 1, there is shown a block diagram of an exemplary high-capacity eDRAM system having a micro-cell architecture designated generally by reference numeral 10. The eDRAM system 10 includes an array of DRAM blocks 12. In the example shown in FIG. 1, the array 12 includes four blocks 16($m$), where $m$=1–4, each storing 4 Mb of data.

Each of the blocks 16(1–4) includes four 1 Mb arrays 18$a$–$d$. Two 1 Mb arrays 18$a,b$ are located on upper and lower corners, respectively, of the right side of each block 16(1–4). The other two 1 Mb arrays 18$c,d$, symmetric to arrays 18$a,b$, are located on upper and lower corners, respectively, of the left side of each block 16(1–4). Arm regions 22, including right and left arm regions 22$r,l$, respectively, are located in each block 16(1–4), with the right arm 22$r$ located between and shared by the upper array 18$a$ and the lower array 18$b$, and the left arm 22$l$ located between and shared by the upper array 18$c$ and the lower array 18$d$. Each 1 Mb array 18$a$–$d$ includes eight banks 24($n$), where $n$=1–8, formed in parallel. Each bank 24($n$) includes four micro-cell units 25 stacked vertically.

A central spine 26 is formed in between the arrays on the left 18$c$, 18$d$ and the arrays on the right 18$a$, 18$b$ of the blocks 16(1–4). The central spine 26 is formed of four spine regions 26', each spine region 26' includes a shoulder region 26$c$, which joins the central spine 26 with one pair of left and right arm region 22$l$, 22$r$, respectively. The central spine 26 provides a central data transfer path for data and control signals.

Figure 2:
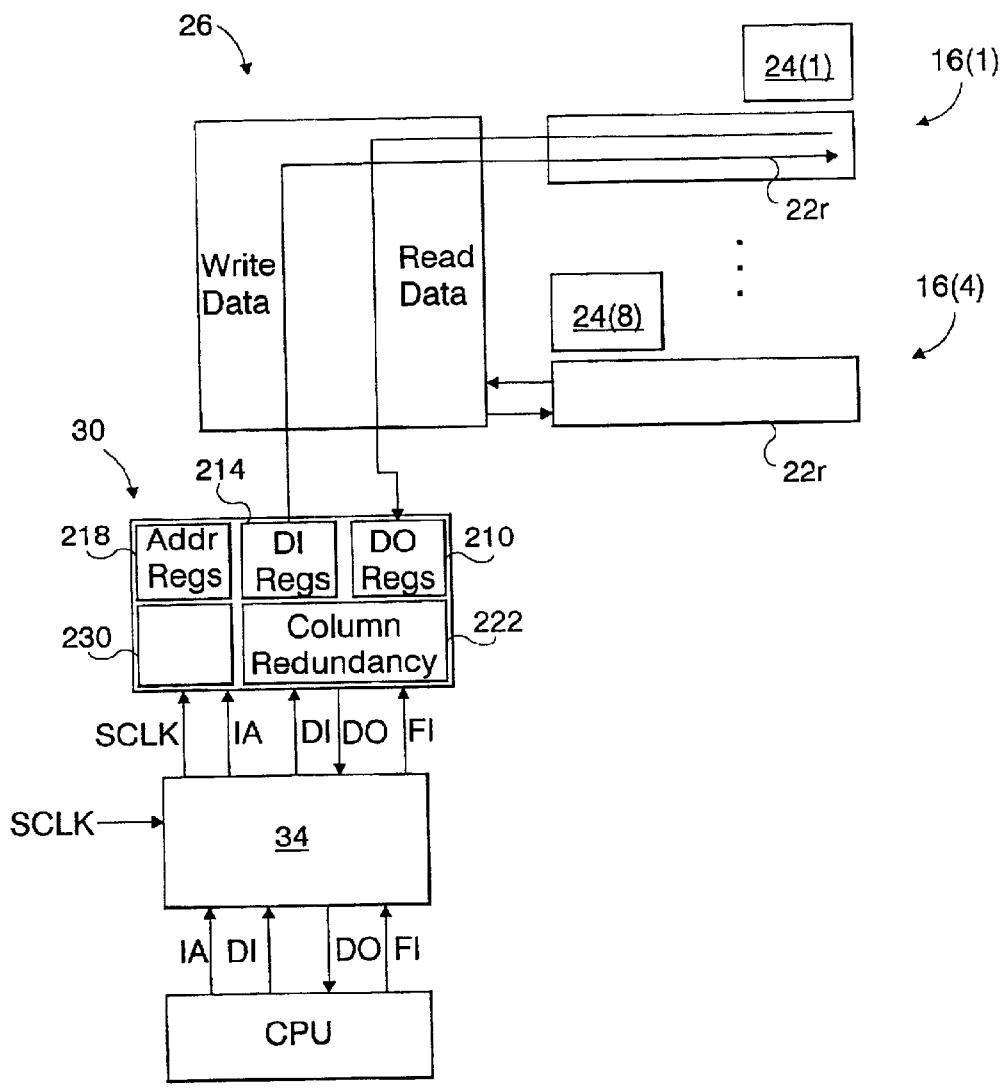
FIG. 2 is a block diagram showing data flow and signal exchange and associated circuits for data being exchanged with a far location and a near location according to the present invention.

The central spine 26 connects below the blocks 16(1–4) to a neck region 30 which houses a column redundancy switch circuit 222, as shown in FIG. 2, for determining whether data being transferred is transferred to (or from) normal bitlines or to (or from) redundant bitlines, as is known in the art. The neck region 30 is further connected to a head region 34, which houses a small SRAM array similar in size to an eDRAM block for providing a cache interface between the eDRAM blocks 16(1–4) and one or more processors, such as a CPU. Included in the SRAM array are two single-port SRAM macros 36$a,b$, which are provided for simultaneous read and write operations. The data transfer data path provided in the central spine 26 provides internal data buses for communication between the eDRAM blocks 16(1–4), the SRAM array within the head region 34 and the one or more processors. Wide internal data transfer buses have a width typically up to 4,000 bytes.

During a write operation, data flowing from the head region 34 is directed through the neck region 30, the central spine 26, one of the shoulder region 26$c$, one of the arm regions 22$l$ or 22$r$, to one of the 1M array 18$a,b,c$ or $d$, and to the destination micro-cell unit 25. Likewise, during a read operation, data flowing from a micro-cell unit 25 is directed through the corresponding arm region 22$l$ or 22$r$, the adjacent shoulder region 26$c$, the central spine 26, the neck region 30, and to the head region 34.

FIG. 1 shows an exemplary data transfer path A–D for transferring data during a data transfer operation. It is to be understood that a write data path is similar to the read data path A–D, but in the reverse direction, i.e., D–A. During a read data transfer operation, path A is the path for data being transferred from cells in a block 16(1–4) to a wordline of a block 16(1–4) activated for the read operation. The data is first amplified by primary sense amplifiers associated with each micro-cell 25, and then by corresponding secondary sense amplifiers associated with each bank 24($n$), as is known in the art. During the read data transfer operation, path B is the path for transferring the data from path A by way of an arm region 22$l$,$r$ to the adjacent shoulder region 26$c$. During the read data transfer operation, path C is the path for transferring data from the shoulder region 26$c$ along the central spine 26 to the neck region 30 of the head region 34. Depending on the location of the micro-cell unit 25 from which the data is being read, the data may be passed through a shoulder region 26$c$ located close to or farther from the head region 34. The traveling time of the data increases the farther the data is located from the head region 34. Finally, during the read data transfer operation, path D is the path for transferring data through the neck region 30 and then to one of the SRAM macros 36$a,b$ of the SRAM array within the head region 34.

As is understood by one skilled in the art, during a write data transfer operation data being transferred follows path D from the head region 34 to the neck region 30, after which the data follows path C from the neck region along the central spine 26 to the shoulder region 26$c$ associated with the arm region 22$l$,$r$ associated with the data bank 24($n$) having the destination micro-cell 25. During the write data transfer operation the data follows path B from the shoulder region 26$c$ to the associated arm region 22$l$,$r$. Finally, during the write data transfer operation, the data follows path A from the arm region 22$l$,$r$ to the secondary sense amplifiers of the associated data bank 24($n$) for sensing, and finally to the destination micro-cell 25 via micro-cell 25's primary sense amplifier, as is known in the art.

Referring to FIG. 2, exemplary first and second banks 24(8) and 24(1), from blocks 16(4) and 16(1), respectively, are shown exchanging data with the neck region 30 via a right arm 22$r$ and the central spine 26. The first bank (i.e., the near bank) 24(8) is located at a near end of an arm 22$r$, and the lowest block 16(4) located nearest to the neck region 30. The second bank (i.e., the far bank) 24(1) is located at a far end of an arm 22$r$ and the highest block 16(1) located farthest from the neck region 30. The neck region 30 is shown to include outgoing data registers (DO registers) 210, incoming data registers (DI registers) 214, address and control registers 218, a column redundancy switch 222, and a delay module 230. The outgoing data register unit 210 may be a First-In-First-Out (FIFO) register to further direct data flow. FIFO registers are well known in the art and will not be further described. The neck receives as input signals from the CPU via the head region 34 a system clock signal SCLK, control signals (i.e., read, write and refresh control signals), incoming address (IA) signals, data-in (DI) signals, data-out (DO) signals, and fuse information (FI) signals (master fuse signal and fuse address bits). Receipt of the input signals is regulated (or timed) by the SCLK signal.

During a data transfer operation, a greater amount of time is required for the transmittal of data to and from the far bank 24(8) than to the near bank 24(1). If the time required for transmittal of data to and from the far bank 24(8) exceeds the time required for transmittal of data to and from the near bank 24(1) by a predetermined time interval, then the data being written to or read from the near bank is apt to collide with the data being written to or read from the far bank, jeopardizing the integrity of the data being written or read, respectively.

The delay module 230 calculates a delay based on the address of the location to which the data is being read or written. During a first system clock cycle, the data address and fuse information signals are sent to the column redundancy switch 222 for performing redundancy operations, as is known in the art. During the first system clock cycle, while the redundancy operations are being performed, the delay module 230 calculates the appropriate delay.

For a write operation, upon completion of the redundancy operations, the data address of the IA signal and a write control signal and incoming data of the DI signals are latched in the address and control registers 218 and DI registers 214, respectively.

During a second system clock cycle, a new set of incoming data, data address and fuse information signals are received from the CPU via the head region 34. At the same time, the address and control signals and the incoming data latched in the address and control registers 218 and DI registers 214 are released in accordance with the delay calculated by the delay module 230. The delay is calculated so that the incoming data will arrive at the bank, which is its destination at a pre-determined time, regardless of the location of the destination bank. Incoming data having a destination bank located closer to the neck region 30 will be delayed for a longer time in the DI registers 214 than data having a destination bank located farther from the neck region 30. Thus, the delay associated with data destined for the near bank 24(8) will be larger than the delay associated with the data destined for the far bank 24(1). In addition, the amount of time that incoming data is held in the DI registers 214, plus the amount of time that it takes for the incoming data to travel to its destination bank is substantially equal for all destination banks.

Similarly, for a read operation, upon completion of the redundancy operations, the data address of the IA signal and a read control signal are latched in the address and control registers 218 registers.

During a second system clock cycle, a new set of data address and fuse information signals are received from the CPU via the head region 34. At the same time, the address and control signals latched in the address and control registers 218 are released in accordance with the delay calculated by the delay module 230. The delay is calculated by the delay module 230 for insuring that the amount of time it takes for the data being read to travel from its bank 24(*n*) to the DO registers 210 plus the amount of time that the address and control signals are held in the address and control registers 218 is equal regardless of the location of the bank 24(*n*) from which the data is being read. The address of data that is being read from the near bank 24(8) is delayed for a longer amount of time in the address and control registers 218 than an address of data being read from the far bank 24(1). By holding a near bank address longer in the address and control registers 218 than an address of a far bank, a read operation for a near bank will take substantially an equal amount of time compared to for a far bank. Data read from the near bank and the far bank requires about the same amount of time to arrive at the DO registers, so that the possibility of a data collision is eliminated.

Figure 3A:
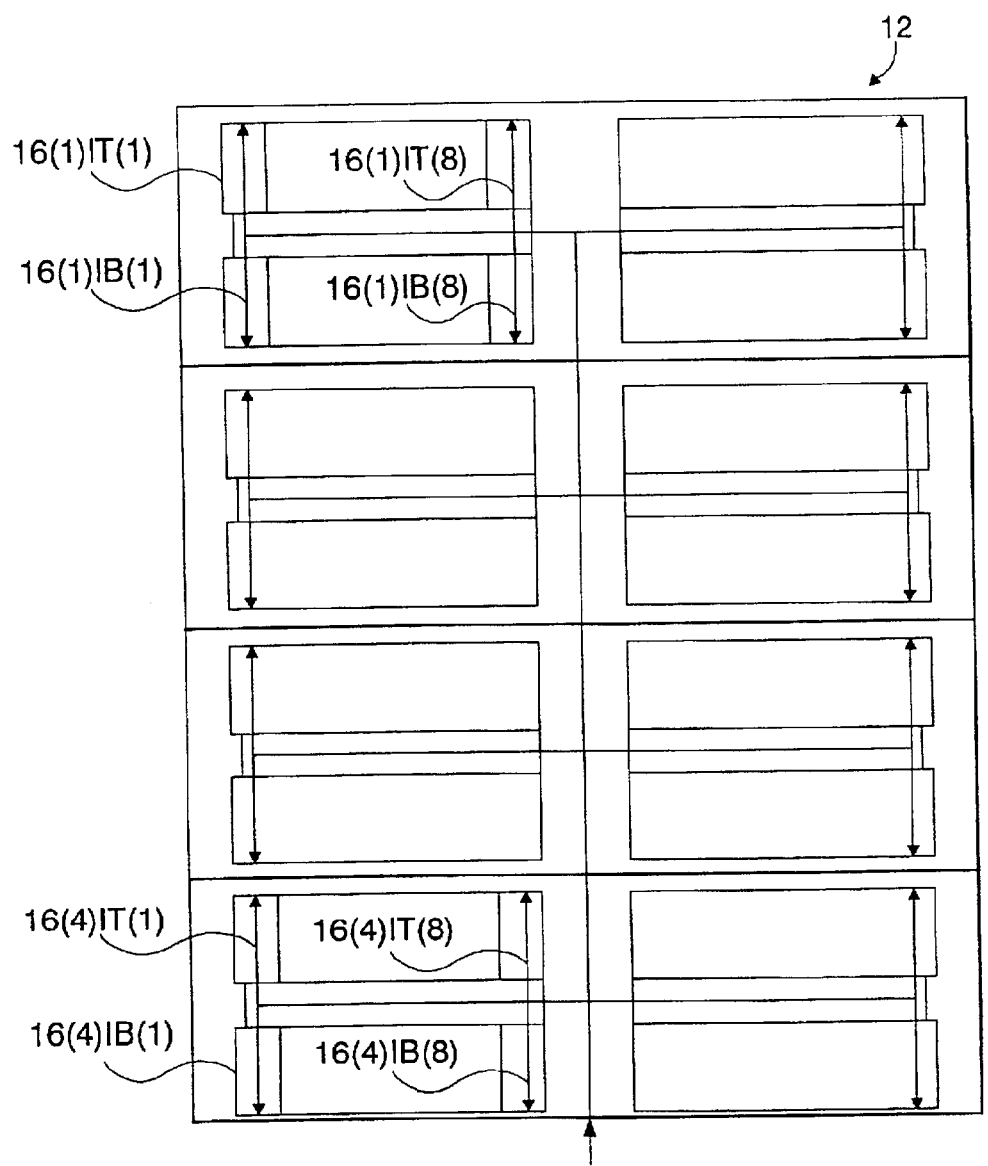
FIG. 3A is a block diagram of the eDRAM array of FIG. 1 showing data flow and addressing according to the present invention.
Figure 3B:
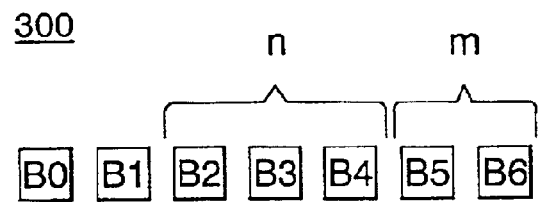
FIG. 3B is a diagram of an incoming address according to the present invention.
Figure 3C:
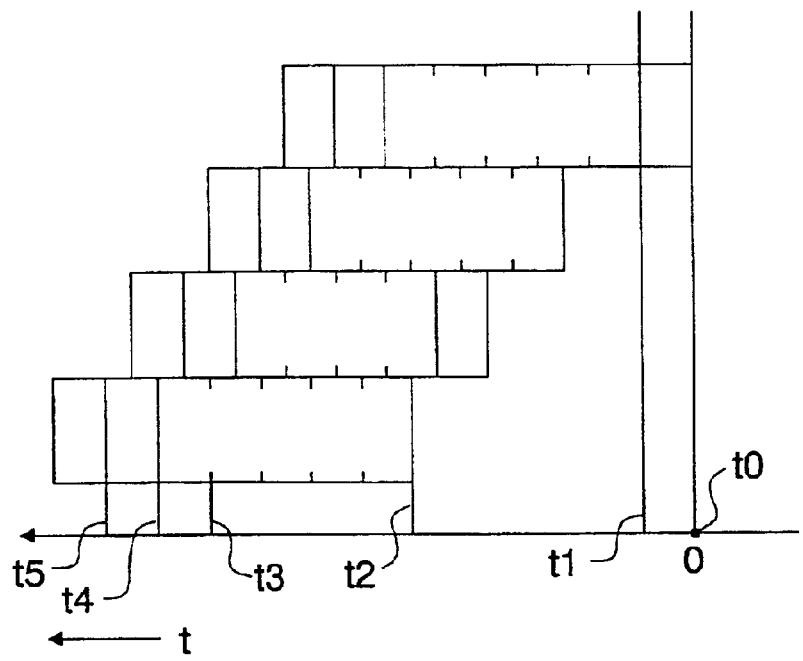
FIG. 3C is a timing diagram of possible delays generated according to the present invention.

With reference to FIGS. 3A–3C, the architecture of the memory and the delay decoding methodology according to the present invention are shown. FIG. 3A shows exemplary addresses within the eDRAM system 10 and possible write data paths. During a write or read operation, data is being transmitted to a micro-cell 25 of a bank 24(*n*) for storage therein or being retrieved from a micro-cell 25 of bank 24(*n*) where it is currently stored. As described above, the location of the block 16(1–4) and the bank 24(*n*) in which the micro-cell 25 is located determines the distance that the data must travel.

According to the addressing system shown, each bank 24(*n*) is located in one of the blocks 16(*m*), where "*m*" indicates the location of the block 16(*m*) in relationship to the neck region 30. Block 16(1) is located farthest from the neck region 30, and data being transferred to or from a bank 24(*n*) in block 16(1) has the greatest associated travel time through the spine 26. Block 16(4) is located closest to the neck region 30, and data being transferred to or from a bank 24(*n*) has the smallest associated travel time through the spine 26. Within the block 16(*m*) that the bank 24(*n*) is located, the bank 24(*n*) is located in one of the 1 Mb arrays 18*a–d*, where 18*a,c* are located above and 18*b,d* are located below the associated arm, 18*a,b* are located to the right of the spine 26 and 18*c,d* are located to the left of the spine 26. Due to the symmetric distribution of the buses to the left and right of the spine 26 and above and below each arm 22, the position of the data bank 24(*n*) above or below the associated arm 22 and to the left or right of the spine 26 does not affect the travel time of data being written to or read from a bank 24(*n*). For each bank 24(*n*), "*n*" indicates the location of the bank 24(*n*) along the arm 22, with "n"=8 indicating that the bank 24(*n*) is located closest to the spine 26 so that data has the smallest travel time to reach the spine 26, and "*n*"=1 indicating that the bank 24(*n*) is located farthest from the spine 26 so that data has the greatest travel time to reach the spine 26.

FIG. 3B shows an incoming address 300 for the location at which data is being accessed for a read or write operation. The address 300 includes seven bits B0–B6. Bits B5–B6, after decoding, provide four possible values "1"–"4" corresponding to the block address "*m*", and similarly bits B2–B4, after decoding, providing eight possible values "1"–"8" corresponding to the bank address "n". B0, B1 and other address bits may be used for other decoding purpose such as to select a word line from the selected memory block 16(*m*).

FIG. 3C is an exemplary timing diagram showing the delay associated with each bank 24(*n*). As shown, the delay depends upon the block location as well as the bank location. In accordance with the four possible block locations and the eight possible bank locations, 32 different delays are generated. The same delays are generated for top and bottom portions of a block 16(m) as well as left and right sides of a block 16(m). Exemplary delays t0–t6 are shown in increasing order. t0 corresponds to block 16(1)lT(8), and the delay t0 in the example is shown to be 0; t1 corresponds to block 16(1)lT(7); t2 corresponds to block 16(4)lT(8); T3 corresponds to block 16(4)lT(3); t4 corresponds to block 16(4) lT(2); t5 corresponds to block 16(4)lT(1) and is the greatest delay generated.

Figure 4:
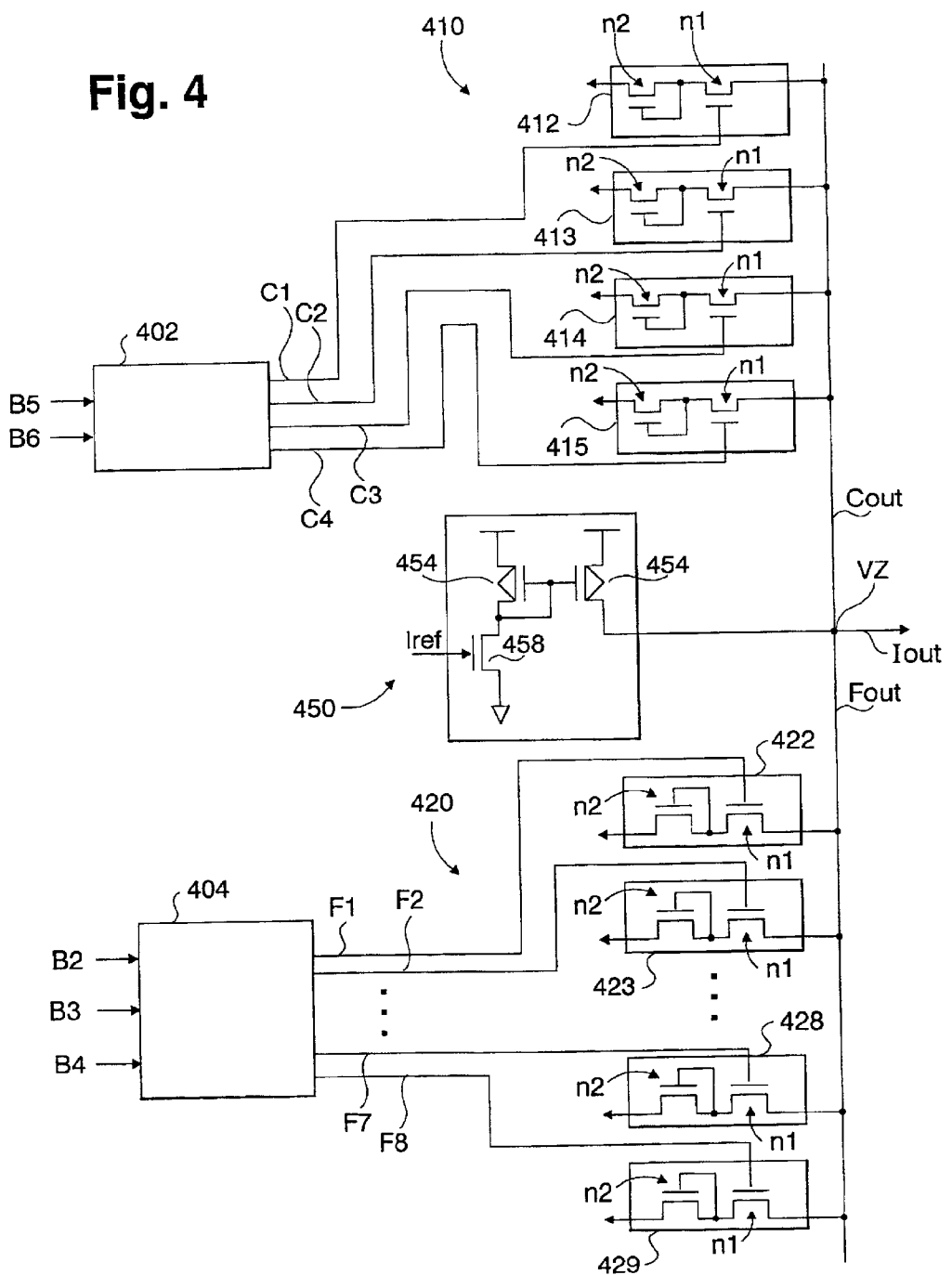
FIG. 4 is a circuit diagram of a programming circuit according to the present invention.

FIG. 4 shows an exemplary digitally adjustable programming circuit 400, which is used to program the clock delay. The programming circuit 400 includes first and second address decoders 402, 404, respectively, a coarse adjustment circuit 410 having pull-down paths 412–415 for programming delays dependent upon the block location of the incoming address; a fine adjustment circuit 420 having to pull-down paths 422–429 for programming delays dependent upon the bank location of the incoming address; and a current mirror 450.

The current mirror 450 receives a reference current Iref as an input, and outputs a mirrored current, as is known in the art. The current mirror 450 includes two pMOS devices 454 and one pull-down nMOS device 458 having a predetermined size. Upon providing the reference current Iref, for example 10 μA, to the gate of pull-down device 458, the same amount of current, e.g., 10 μA, is reflected and output to node VZ. The outputs of the coarse adjustment circuit 410 and the fine adjustment circuit 420 are also connected at node VZ for determining the total current load of signal IOUT to be output from the programming circuit at node VZ.

The first address decoder 402 receives address bit signals B5 and B6 and outputs signals C1–C4. A different one of signals C1–C4 is set to "one", with the other signals of C1–C4 set to "zero", for each of the four respective possible values provided by bits B5 and B6. The second address decoder 404 receives address bit signals B2, B3 and B4 and outputs signals F1–F8. A different one of signals F1–F8 is set to "one", with the other signals of F1–F8 set to "zero", for each of the eight respective possible values provided by B2–B4.

The spine timing adjustment circuit 410 receives signals C1–C4, which are provided to pull-down paths 412–415, respectively, and outputs a signal Cout having a current biased in accordance with pull-down paths 412–415. The arm timing adjustment circuit 420 receives signals F1–F8, which are provided to pull-down paths 422–429, respectively, and outputs a signal Fout having a current biased in accordance with the pull-down paths 422–429.

In the example shown, each pull-down path 412–415 and 422–429 includes two nMOS devices, n1, n2, connected in series. Each device n1 functions as a switch operated by the associated signal C1–C4, F1–F8 connected to its gate for enabling or disabling the associated pull-down path 412–415 and 422–429.

Each device n2, where its gate is connected to the drain of the associated device n1, acts like a resistor for controlling in an analog fashion the current load passing through the device n2. Each device n2 is provided in a size having a selected width to length ratio, selected relative to the width to length ratio of pull-down device 458 of the current mirror 450, for determining current load to passing through the device n2 relative to Iref. Thus, the size of each device n2 is selected for providing each signal output by pull-down paths 412–415 and 422–429 with a selected current load relative to Iref.

In the preferred embodiment, the size for each device n2 of pull-down paths 412–415 are selected for tuning the current load of the output of pull-down paths 412–415 to increase linearly, such as by 1Y, 2Y, 3Y and 4Y, respectively, where Y=J*Iref. With this arrangement, travel time (including delay time) for data traveling to each shoulder along the spine is programmable. The size for each device n2 of pull-down paths 422–429 are selected for tuning the current load of the output of pull-down paths 422–429 to increase linearly, such as by 1X, 2X, 3X, 4X, 5X, 6X, 7X and 8X respectively, where X=K*Iref. With this arrangement, travel time (including delay time) for data traveling time to each of the 8 banks along the arm region is programmable.

Exemplary Tables A,B below show each combination of signals C1–C4 and F1–F8 output by the first and second address decoders 202, 204, respectively, for providing signals Cout and Fout, respectively, and their associated selected current loads. The current loading provided is inversely proportional to the distance of the block 16(m) and bank 24(n) from the neck region 30.

TABLE A

| C1 | C2 | C3 | C4 | Cout |
|----|----|----|----|------|
| 1  | 0  | 0  | 0  | 1X   |
| 0  | 1  | 0  | 0  | 2X   |
| 0  | 0  | 1  | 0  | 3X   |
| 0  | 0  | 0  | 1  | 4X   |

X = J*Iref

TABLE B

| F1 | F2 | F3 | F4 | F5 | F6 | F7 | F8 | Fout |
|----|----|----|----|----|----|----|----|------|
| 1  | 0  | 0  | 0  | 0  | 0  | 0  | 0  | 1Y   |
| 0  | 1  | 0  | 0  | 0  | 0  | 0  | 0  | 2Y   |
| 0  | 0  | 1  | 0  | 0  | 0  | 0  | 0  | 3Y   |
| 0  | 0  | 0  | 1  | 0  | 0  | 0  | 0  | 4Y   |
| 0  | 0  | 0  | 0  | 1  | 0  | 0  | 0  | 5Y   |
| 0  | 0  | 0  | 0  | 0  | 1  | 0  | 0  | 6Y   |
| 0  | 0  | 0  | 0  | 0  | 0  | 1  | 0  | 7Y   |
| 0  | 0  | 0  | 0  | 0  | 0  | 0  | 1  | 8Y   |

Y = K*Iref

Figure 5A:
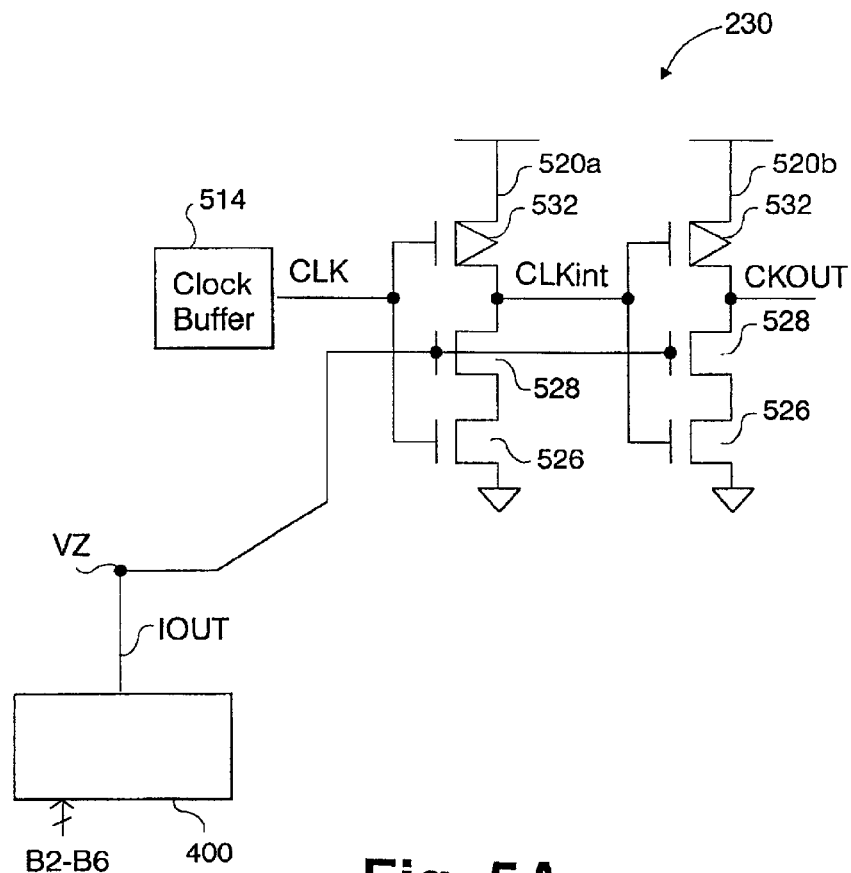
FIG. 5A is a circuit diagram of a delay module according to the present invention.

The formation of a delayed signal for releasing the latched address and incoming data is described with reference to FIGS. 5A and 5B. FIG. 5A shows the delay module 230 including a delay circuit 510 connected to the programming circuit 400. The delay circuit 510 receives as input signals the signal IOUT output from the programming circuit 400 at node VZ, and a redriven system clock signal CLK provided from a clock buffer 514. The delay circuit 510 outputs a delayed clock CKOUT, which is the signal CLK delayed proportionately to the current loading of the signal IOUT. The CKOUT signal is provided to the DI and address registers 214, 218 where the data and address are latched for release thereof.

The delay circuit 510 includes first and second delay controlled inverter circuits 520a,b, respectively, each having first and second pull-down devices 526, 528, respectively, and a pull-up device 532. The CLK signal is provided to the gates of the first pull-down device 526 and the pull-up device 532 of the first inverter circuit 520. The IOUT signal is provided to the gate of the second pull-down device 528, which acts as a voltage dependable resistor, of the first and second inverter circuits 520a,b. A clock signal CLKint is output from the first inverter circuit 520a and is provided to the gates of the of the first pull-down device 526 and the pull-up device 532 of the second inverter circuit 520*b*.

Figure 5B:
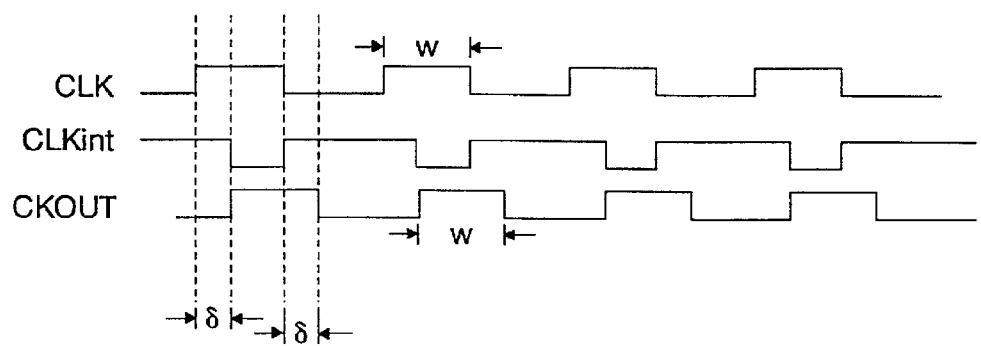
FIG. 5B illustrates waveforms displaying delayed clock signals according to the present invention.

FIG. 5B shows the waveforms of the clock signals CLK, CLKint and CKOUT. The operation of the delay circuit 510 and the waveforms produced will now be discussed. The first inverter circuit 520*a* receives the input CLK signal and the IOUT signal and outputs the signal CLKint. The current load of IOUT applied to the first pull-down device 526 of inverter circuit 520*a* outputs a signal in which the CLK signal is inverted and its rising edge is delayed by a delay.

The second inverter circuit 520*b* receives the CLKint signal and the IOUT signal and outputs the signal CKOUT. The current load of IOUT applied to the first pull-down device 526 of the second inverter circuit 520*b* outputs a signal in which the CLKint signal is inverted and its rising edge is delayed by a delay δ. CKOUT signal's rising edge is the inversion of the falling edge of the CLKint signal which is the delayed and inverted rising edge of the CLK signal. CKOUT signal's falling edge is the delayed inversion of the rising edge of the CLKint signal, which is the inverted falling edge of the CLK signal. In both inverter circuits 520*a,b*, delays δ associated with the rising and falling edge of the CKOUT signal, are the same and are determined by the current load of IOUT. Thus, the rising and falling edges of the CKOUT signal have both been delayed an equal amount, so that the CKOUT signal has the same pulse width w as the CLK signal for assuring that a data-latching window is not compromised during a high-speed write operation.

As described above, the delay δ of the CLKOUT signal relative to the CLK signal is determined by IOUT, which is determined by the four possible values of Cout and the eight possible values of Fout, which are determined, respectively, by the outputs of decoders 402, 404 decoding the incoming address. The current load of Cout, 1–4Y, where Y is jIREF, Thus, the 32 possible combinations of C1–C4 and F1–F8 provide for 32 possible values of delay δ corresponding to 32 possible data travel times. In the preferred embodiment, the portion of the delay δ determined by Cout having current loads 1Y, 2Y, 3Y, and 4Y, where Y=j*Iref, j is selected to provide respective delays of 1y, 2y, 3y and 4y, where y=150 ps. The portion of the delay δ determined by Fout having current loads 1X, 2X, 3X, 4X, 5X, 6X, 7X and 8X, where X=k*Iref, k is selected to provide respective delays of 1x, 2x, 3x, 4x 5x, 6x, 7x and 8x, where x=55 ps. The desired delay is selectable by selecting the n2 devices of pull-down paths 412–415 and 422–429, selecting the pull-down device 458 of the current mirror 450, and selecting Iref.

It is to be understood that the delay module 230 could be used with different semiconductor memory system arrays having a different architecture and addressing system, where a programming circuit is provided that decodes the address accordingly and provides a current load IOUT corresponding to the delay desired.

The response time of the delay circuit 510 is quick enough for use with a system clock rate as low as 3.2 ns. In simulation tests using an HSPICE simulation tool and the inventive system and method, dynamic clock delays ranging between 0.1 ns and 0.8 ns were achieved. A delay up to 0.5 ns is sufficient for use with a 16M array.

What has been described herein is merely illustrative of the application of the principles of the present invention. For example, the systems described above and implemented as the best mode for operating the present invention are for illustration purposes only. As a particular example, for instance, other design configurations may be used for read operations, which provide similar operation as the system described herein, in reverse order. In other words, other arrangements and methods may be implemented by those skilled in the art without departing from the scope and spirit of this invention.

We claim:

1. A timing system for controlling timing of data transfers within an embedded semiconductor memory system, the timing system comprising:
    means for generating a bias signal, wherein the bias signal is biased in accordance with a data address of the memory system of data being transferred; and
    means for receiving the bias signal and generating an output clock signal, wherein
        the timing of the output clock signal is programmable in accordance with the bias signal and the means for generating the output clock signal receives a pulsating clock signal, a width of pulses of said pulsating clock signal and said output clock signal are approximately the same.

2. The timing system according to claim 1, wherein the semiconductor memory is an embedded DRAM (cDRAM) memory.

3. The timing system according to claim 1, wherein the bias signal is biased in accordance with the location of a memory cell corresponding to the memory address relative to a control region of the memory system.

4. The timing system according to claim 3, wherein the data address includes first and second portions indicating the location of the memory cell relative to the control region in first and second dimensions, respectively.

5. The timing system according to claim 4, wherein:
    the means for generating the bias signal includes first and second biasing circuits;
    the first and second portions of the incoming data transfer address are provided to the first and second biasing circuits, respectively, for generating first and second dimension bias signals; and
    the means for generating the bias signal combines the first and second dimension bias signals to generate the bias signal.

6. The timing system according to claim 1, wherein in least one of data, data address and control signal are held in a means for holding data, addresses and control signals, wherein an amount of time the at least one of dais, data address and control signals are held is controlled by the output clock signal.

7. The timing system according to claim 6, wherein during a first memory system clock cycle the amount of time is calculated and the at least one of data, data address and control signal are held in the means for holding, and during a subsequent second memory system clock cycle the at least one of data, data address and control signal are released from the means for holding in accordance with the amount of time and a different amount of time is calculated and a different at least one of data, data address and control signal are held in the means for holding for a subsequent data transfer.

8. The timing system according to claim 1, wherein the sum of an amount of time that the data is held in the means for holding and an amount of time that the data travels between a memory cell corresponding to the data address and the means for holding is a predetermined amount of time.

9. The timing system according to claim 1, wherein the means for generating the bias signal further includes a decoder circuit for decoding the data address and outputting at least one signal indicative of the data address.

10. The timing system according to claim 9, wherein:

the means for generating the bias signal includes at least one bias stage for receiving a respective signal of the at least one signal indicative of the data address and outputting a signal biased relative to the received signal; and the signal output by each bias stage of the at least one bias stage are combined to generate the bias signal.

11. The timing system according to claim 1, wherein a delay of the timing of the output clock signal is inversely proportional to a distance between a memory cell corresponding to the data address and the means for holding.

12. The timing system according to claim 1, wherein the means for generating the output clock signal receives a pulsating clock signal and includes first and second delay stages; and wherein:

the means for generating the output clack signal;

the pulsating clock signal and bias signal are provided to the first delay stage for generating an intermediate clock signal having a pulse rhythm similar to the pulsating clock signal and delayed by a first delay of the timing delay; and the intermediate clock signal and the bias signal are provided to the second delay stage for generating the output clock signal having a pulse rhythm similar to the pulsating clock signal and delayed by a second delay of the timing delay.

13. The timing system according to claim 12, wherein:

the first delay stage inverts the pulsating clock signal;

the first delay is the delay between the rising edge of a pulse of the pulsating clock signal and a falling edge of the inverted intermediate clock signal;

the second delay stage inverts the intermediate clock signal; and the second delay is the delay between the rising edge of the intermediate clock signal and the falling edge of the output clock signal.

14. The timing system according to claim 12, wherein the duration of die first and second delays is approximately the same.

15. The timing system according to claim 12, wherein the bias signal is a bias current signal;

each of the firs: and second delay stages are delay controlled inverters having first and second nMOS devices and a pMOS device in series;

the pulsating clock signal is provided to gates of the first nMOS and pMOS devices of the first stage;

the bias signal is provided to gates of the second nMOS device of the first and second stages; and the intermediate clack signal output from a node between the second nMOS and pMOS devices of the first delay stage is provided to the gates of the first nMOS and pMOS device of the second delay stage.

16. A method for controlling timing a data transfers within an embedded semiconductor memory system comprising the steps of:

receiving a data address of a memory cell of the memory system transferring data;

processing the data address;

generating a bias signal in accordance with the processed data address;

generating a clock output signal having a delay in accordance with the bias signals wherein the clock output signal receives a pulsating clock signal, where a width of pulses of said pulsating clock signal and said clock output signal are approximately the same and controlling release of data held in a control region of the memory system during a data transfer via the clock output signal.

17. The method according to claim 16, wherein the data address is indicative of the location of the memory cell relative to the control region, and the bias signal is generated in accordance with the location of the memory cell corresponding to the processed data address.

18. The method according to claim 17, wherein the sum of an amount of time that the data is held in the control region and an amount of time that the data travels between the memory cell and the control region is a predetermined amount of time.

19. The method according to claim 16, wherein the delay of the clock output signal is relative to a system clock signal of the eDRAM system.

* * * * *

UNITED STATES PATENT AND TRADEMARK OFFICE
CERTIFICATE OF CORRECTION

PATENT NO. : 6,751,156 B2
DATED : June 15, 2004
INVENTOR(S) : Hsu et al.

It is certified that error appears in the above-identified patent and that said Letters Patent is hereby corrected as shown below:

Column 11,
Line 18, "clack" should be -- clock --
Line 42, "die" should be -- the --

Column 12,
Line 3, ".firs:" should be -- first --
Line 10, "clack" should be -- clock --

Signed and Sealed this

Eighth Day of February, 2005

JON W. DUDAS
*Director of the United States Patent and Trademark Office*